United States Patent [19]

Benhamou

[11] 4,056,808
[45] Nov. 1, 1977

[54] ULTRASONIC REMOTE CONTROL RECEIVER SUITABLE FOR TV RECEIVER

[75] Inventor: Jean Pierre Benhamou, Houston, Tex.

[73] Assignee: Texas Instruments Incorporated, Dallas, Tex.

[21] Appl. No.: 681,928

[22] Filed: Apr. 30, 1976

[51] Int. Cl.² .............................................. H04B 1/06
[52] U.S. Cl. ........................ 340/171 PF; 340/171 R; 340/171 A; 325/391; 358/194
[58] Field of Search .............................. 178/DIG. 15; 340/146.1 BA, 171 PF, 171 R, 171 A; 325/391

[56] References Cited

U.S. PATENT DOCUMENTS

| 3,523,278 | 8/1970 | Hinkel | 340/146.1 BA |
|---|---|---|---|
| 3,737,577 | 6/1973 | Birkin | 340/146.1 BA |
| 3,863,215 | 1/1975 | McGrogan | 340/146.1 BA |
| 3,876,980 | 4/1975 | Haemmig | 340/146.1 BA |
| 3,980,956 | 9/1976 | Wooling | 178/DIG. 15 |

Primary Examiner—Harold I. Pitts
Attorney, Agent, or Firm—Harold Levine; Richard L. Donaldson; James T. Comfort

[57] ABSTRACT

Ultrasonic remote control receiver wherein reference frequency pulses are counted during a counting cycle comprising a predetermined number of received command signals, each command signal occupying a different frequency channel. At the end of each counting cycle, the reference frequency count is compared with the count during the preceding counting cycle. A validated output from the receiver occurs only after a predetermined number of uninterrupted identical comparisons have occurred. Interference with a validated output signal by spurious received signals e.g. noise signals is minimized by providing for invalidation of an output signal only after a predetermined number of uninterrupted non-identical count comparisons. Two of the receiver outputs are used to generate a variable duty cycle pulse train, one output increasing and the other decreasing the duty cycle. A receiver is disclosed in the context of a TV broadcast receiver wherein the variable level d.c. control signal is used to control an electronic sound attenuator. The remote control receiver also includes power-on-reset and mute functions. Each of the remote control receiver outputs has a parallel connected manual switch, to some of which anti-bounce circuits are connected.

16 Claims, 11 Drawing Figures

ULTRASONIC REMOTE CONTROL RECEIVER SUITABLE FOR TV RECEIVER

BACKGROUND OF THE INVENTION

This invention relates to a remote control receiver for the reception of command signals having different frequencies each associated with a particular command function, and responsive thereto to generate an appropriate signal at a corresponding output channel of the receiver.

One such receiver is described in U.S. Pat. No. 3,855,575 issued Dec. 17, 1974, to Horst Leuschner et al. and assigned to Texas Instruments Incorporated, for "Ultrasonic Remote Control Receiver". In that receiver, an incoming ultrasonic command signal is converted to square wave pulses of the same frequency, the pulses then being counter over a fixed period of time. The circuit for determining the duration of the measuring period must be accurately adjusted prior to operation of the receiver so that the desired counting results actually will be achieved when counting the received command signals.

An alternative remote control receiver is disclosed by copending application Ser. No. 681,949 filed April, 1976 by Horst Leuschner and Lembit Soobik for REMOTE CONTROL RECEIVER. In that receiver, a command signal frequency counter counts a predetermined number of command signal cycles. An output signal from the command signal frequency counter controls a reference frequency counter so that the latter counts reference frequency cycles for the period of time during which the predetermined number of command signal cycles is received. The reference frequency counter count reached after the reception of the predetermined number of command signal cycles, therefore, is directly related (inversely proportional) to the command signal frequency received. The count of the reference frequency counter reached in one counting cycle of the command signal counter can be stored in a storage device whose content is then compared by a comparator circuit with the new reference frequency counter count reached after each counting cycle of the command signal frequency counter. The output signal of the comparator circuit indicating agreement or non-agreement of the compared values is supplied to an error register arrangement which releases a control signal at the receiver output associated with the particular command signal received, only after a predetermined number of uninterrupted subsequent agreements of the compared values has been achieved.

Such a receiver is advantageous in that, for example, the minimum counting cycle duration can be considerably reduced compared with the measurement time required to count a succession of incoming command signals by a receiver as described in U.S. Pat. No. 3,855,575. Additionally, this alternative form of receiver is operable by command signal frequencies which are an integer fraction of a fixed reference frequency and thus readily generated by a programmable divider.

SUMMARY OF THE INVENTION

According to the present invention, there is provided a remote control receiver for receiving command signal pulses of different operating frequencies in individual signal channels within a selected frequency range, said receiver having an individual output for each signal channel. The remote control receiver includes means for dividing the frequency of received command signal pulses by a predetermined factor to produce sequence control pulses. A sequence generator is responsive to each sequence control pulse resulting from reception of a command signal within the selected frequency range to initiate a new counting cycle. A reference frequency counter counts reference frequency pulses in each of the counting cycles. Command signal pulses in each channel give rise to a different count of the reference frequency counter during a counting cycle. The count of the reference frequency counter reached during a counting cycle is stored by storage means and a comparator circuit compares at the end of each counting cycle the count of the reference frequency counter with the existing count stored by the storage means and produces a first signal indicating identity between such counts and a second signal indicating non-identity between such counts. The first signals are applied as count inputs to a second counter and as clear inputs to a third counter. The second signals are applied as count inputs to the third counter and as clear inputs to the second counter. A decoder circuit is connected for receiving the count of the storage means to generate an output signal and an output of the receiver determined by that count. Validation means is selectively actuable to transfer the count of the storage means to the decoder circuit means and means responsive to a predetermined count of the second counter activates the validation means while means responsive only to a predetermined different count of the third counter inactivates the validation means. In a preferred embodiment, following response to the predetermined count of the second counter, the validation means continues to be activated during sequences of the second signals less than the different predetermined count.

In a particular embodiment, first and second outputs of the decoder circuit are connected to respective input gating means for controlling application of clock pulses to up and down inputs of an n stage up/down counter. Respective stages of the up/down counter are connected to respective ones of n rate inputs of an n-bit digital word to duty cycle converter means for receiving input pulses at the reference frequency, to control the output duty cycle of the converter means as a function of the count of the up/down counter means. The converter means may include an n-bit counter and a sequence of n multi-input gates each connected to receive a number of inputs from the bits of the n-bit counter according to its rank in the sequence. The bit outputs of the up/down counter are connected as respective inputs to the multi-input gating means which have outputs connected as inputs to a single output gating device for producing an output signal in response to an output from any of the multi-input gating means. Advantageously, the n-bit counter additionally forms part of the reference frequency counter.

BRIEF DESCRIPTION OF THE DRAWINGS

By way of example, an embodiment of the invention will be described in greater detail, pointing out further advantageous features of a receiver embodying the invention, with reference to the drawings wherein.

DESCRIPTION OF THE PREFERRED EMBODIMENT

Figure 1:
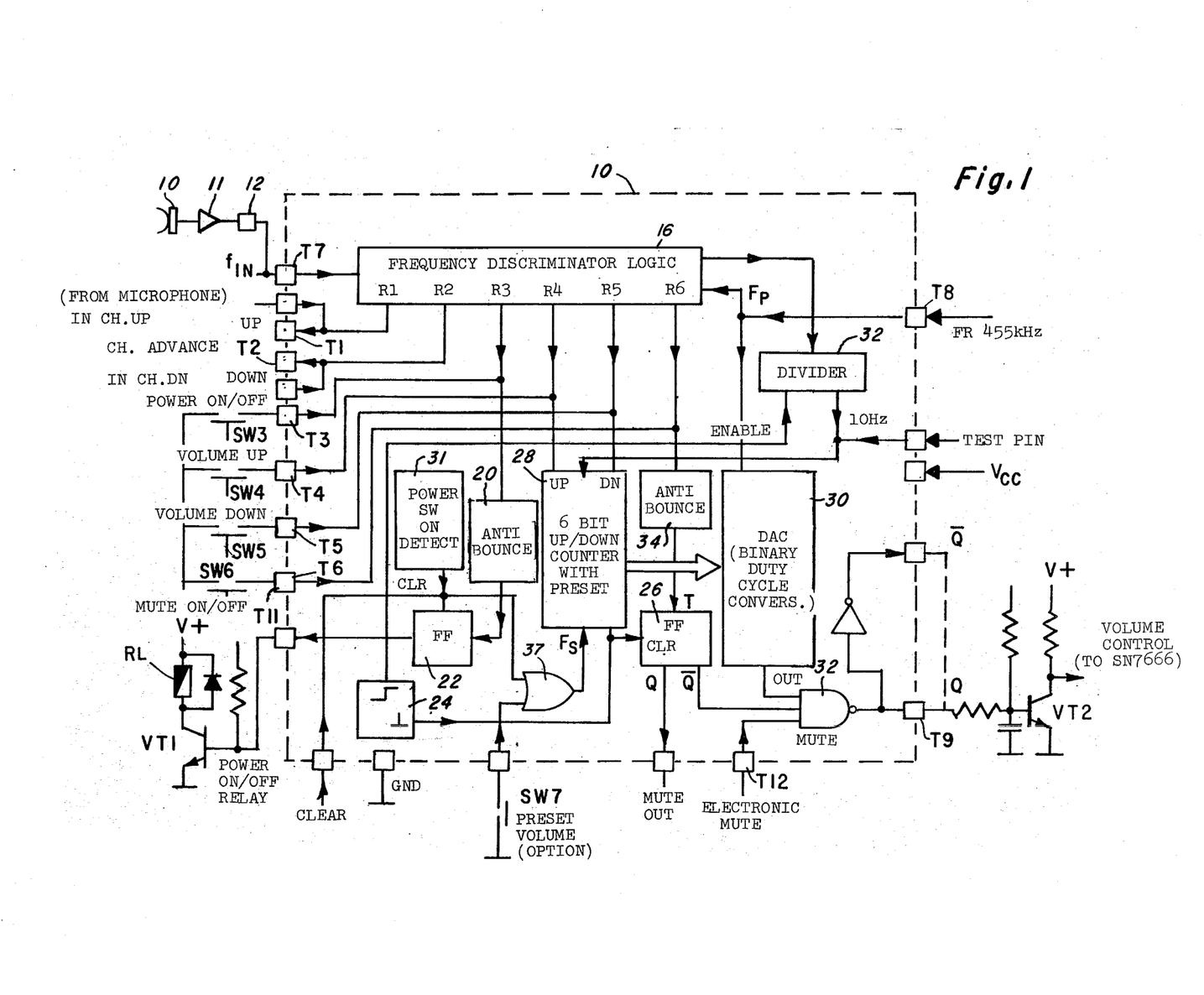
FIG. 1 is a functional block diagram of a remote control receiver embodying the invention.

FIG. 1 shows a block schematic of an ultrasonic signal remote control receiver 10 embodying the present invention. The receiver is responsive to command signals occupying respective channels in a predetermined ultrasonic frequency band, each command signal corresponding to a particular command function. For example, in the embodiment being described — which is particularly suited for use in conjunction with a TV broadcast receiver — the remote control receiver is responsive to six command functions, namely POWER ON/OFF; VOLUME UP/DOWN; CHANNEL ADVANCE UP/DOWN; and MUTE. Suitable frequency channels for these command functions are identified in TABLE A.

TABLE A

| Command Function | Command Signal Frequency Channel |
|---|---|
| VOLUME UP | 39.375 – 40.95 kHz |
| VOLUME DOWN | 37.917 – 39.375kHz |
| POWER ON/OFF | 36.562 – 37.917kHz |
| MUTE | 35.30 – 36.562kHz |
| CHANNEL UP | 34.125 – 35.30kHz kHz |
| CHANNEL DOWN | 33.024 –0 34.125kHz |

In response to reception and validation of a particular command signal, an output is produced at a corresponding output channel of the remote control receiver.

An incoming command signal Fin (F1–F6) is detected by ultrasonic transducer e.g. a microphone 11 and passed through an active band-pass filter 12 and, after conversion to rectangular pulses by Schmitt trigger 13 to the input terminal T7 of a frequency and detector logic network 16. The network 16 also receives a reference frequency input Fr of substantially higher frequency than the command signals, e.g. 455kHz, supplied via an input terminal T8 from an external source (not shown), suitably from an oscillator whose frequency is determined by a radio AM IF resonant circuit. During a detection cycle, the network 16 counts the number of cycles of integral fractions of the reference frequency Fr occuring during an integral number of cycles of the incoming signal Fin. When a particular count corresponding to the same command signal is obtained during a predetermined number of detection periods, the command signal is validated and the network 16 generates an output at one of the outputs R1–R6 corresponding to that command signal, the enabled output going to a low condition.

A command signal F1 or F2 (corresponding to a CHANNEL ADVANCE UP or CHANNEL ADVANCE DOWN command) detected and validated by the network 16, results in output R1 or R2, respectively, going low thereby providing a utilization signal at terminal T1 or T2 for the TV broadcast receiver automatically to step between broadcast channels until a desired channel is received.

A validated command signal F3 (corresponding to a POWER ON/OFF command) results in output R3 switching to a low condition, the output being passed to an anti-bounce circuit 20 to toggle a flip-flop 22, the Q output of which turns on a power control transistor VT1 of the TV broadcast receiver to activate a switching relay RL in its collector circuit to connect or disconnect a d.c. supply to the broadcast receiver. The Q output of the flip-flop 22 also is applied to a positive edge differentiator 24, the differentiated output being applied to clear a flip-flop 26.

A validated command signal F4 or F5 (VOLUME/UP or VOLUME/DOWN) respectively results in output R4 or R5 of network 16 going low and applying an up-enable input or a down-enable input to an up/down counter 28 which together with a binary rate multiplier DAC 30 generates a variable duty cycle output, suitable after integration for use as an electronic volume control signal for the TV receiver. Assuming that the output R4 goes low, the count of the counter 28 is incremented by a 10Hz input from a frequency divider 33, the bit outputs of the counter 28 being applied as parallel rate inputs to the DAC 30. The reference frequency FR is also applied as an input to the DAC 30 which generates an output having a duty cycle which changes as a function of the count of counter 28, applied as parallel rate inputs to the DAC 30. The output from the DAC 30 is applied via NAND gate 32 to an output terminal T9 for connection as a base input for a transistor VT2 in the TV broadcast receiver, which integrates the output from the DAC 30 to provide a d.c. level at the collector of transistor VT2, increasing with the count of counter 28. The collector voltage of transistor VT2 may be used to operate a volume control (sound attenuator) integrated circuit such as, for example, type SN76660 manufactured and sold by Texas Instruments Incorporated, Dallas, Tex., to adjust the sound level output from the TV receiver. In response to the VOLUME/DOWN output R5 going low, the counter 28 decrements, resulting in a time decreasing duty cycle output from the DAC 30 instead of a time-increasing duty cycle output when the output R4 goes low. Thus, depending on whether output R4 or output R5 goes low, the volume control of the television broadcast receiver is operated to progressively increase or decrease sound level until a desired level has been achieved. If neither R4 nor R5 goes low, the count of the up/down counter 28 remains unchanged and the duty cycle at terminal T9 (and thus the d.c. collector voltage of transistor VT2) remains unchanged indefinitely, unless the supply voltage to the remote control receiver is switched off. Thus, counter 28 is effective as a memory for the volume controlling d.c. voltage at the collector of the transistor VT2.

In response to a validated MUTE ON/OFF command signal, the output R6 of network 16 switches to a low condition and is applied to an anti-bounce circuit 34, the output of which is applied as a clock to flip-flop 26.

The TV broadcast receiver also includes a power switch-on detector circuit 31 which, responsive to initial connection of the TV receiver to a power supply outlet or resumption of power after a black-out, applies a CLEAR signal to the flip-flop 22 and, via AND gate 37 to the counter 28. The Q output of flip-flop 22, connected to the base of transistor VT1, goes low and ensures that the d.c. supply V+ to the TV receiver is switched off.

The remote control receiver 10 also includes terminals T3-T6 connected respectively to outputs R3-R6 may manually be switched to a low condition by operation of switches SW3-SW6 incorporated in the TV broadcast receiver.

Figure 2:
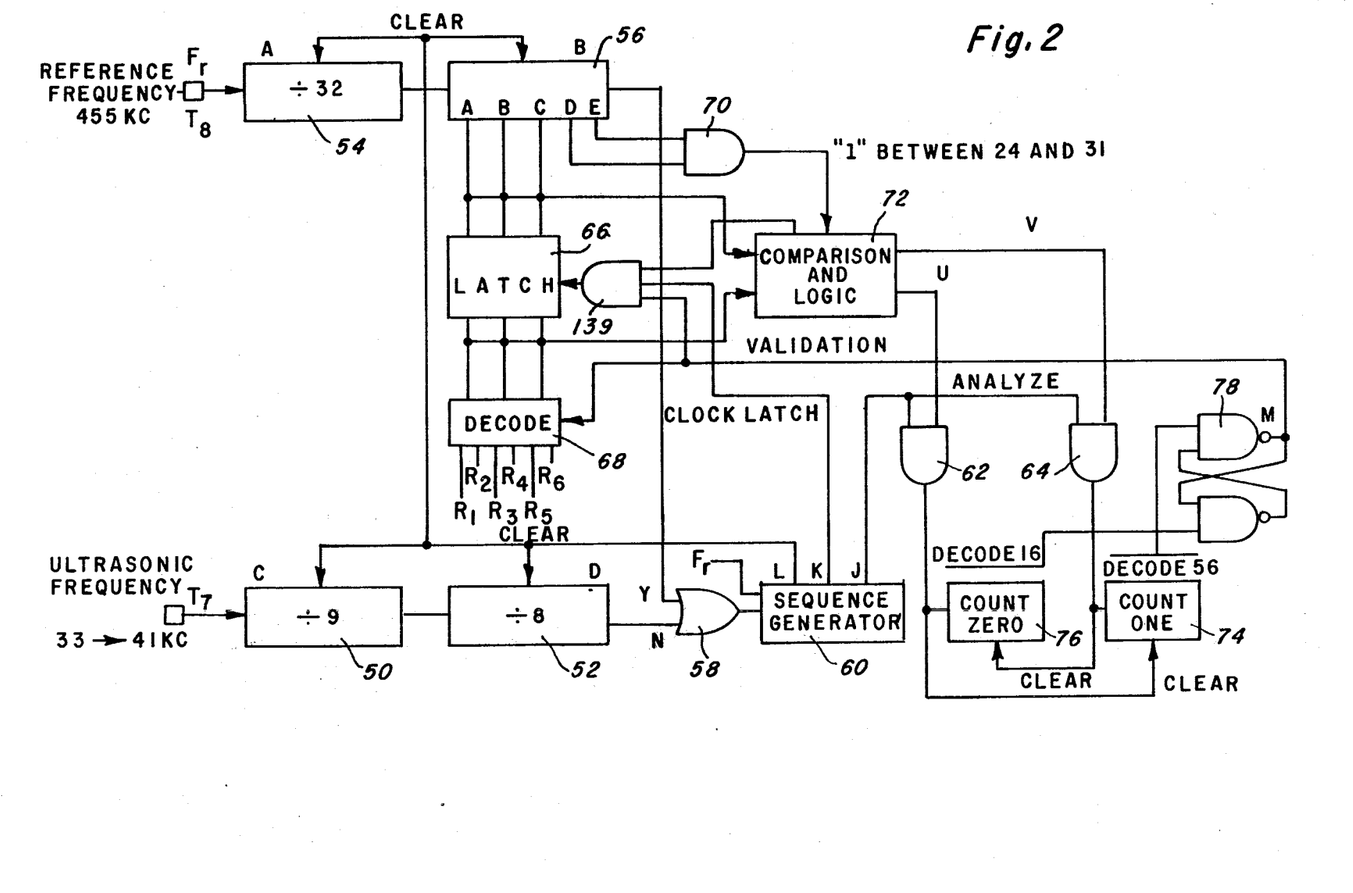
FIG. 2 is a schematic logic diagram of the frequency discriminator shown in FIG. 1.

FIG. 2 shows in block schematic form, the frequency discriminator logic 16 of FIG. 1. Incoming ultrasonic command signals Fin after conversion to pulses by the Schmitt trigger 13, as explained above, are fed sequentially to dividers 50 and 52 which respectively effect frequency division by factors of 9 and 8, giving an overall division factor of 72. The reference frequency Fr (455kHz) is passed in sequence through a divider 54, effecting frequency division by a factor of 32, and a 5-stage counter 56. For nominal command signal frequencies as shown in TABLE A, the count of counter 56 will range from 25 to 30 for the individual command signal channels, as shown in TABLE B.

TABLE B

| Channel No (Decoder O/P) | Count of Counter 56 | Nominal Command Signal Frequency(kHz) |
| --- | --- | --- |
| R1 | 25 | 40.163 |
| R2 | 26 | 38.646 |
| R3 | 27 | 37.239 |
| R4 | 28 | 35.931 |
| R5 | 29 | 34.713 |
| R6 | 30 | 33.575 |

Figure 3:
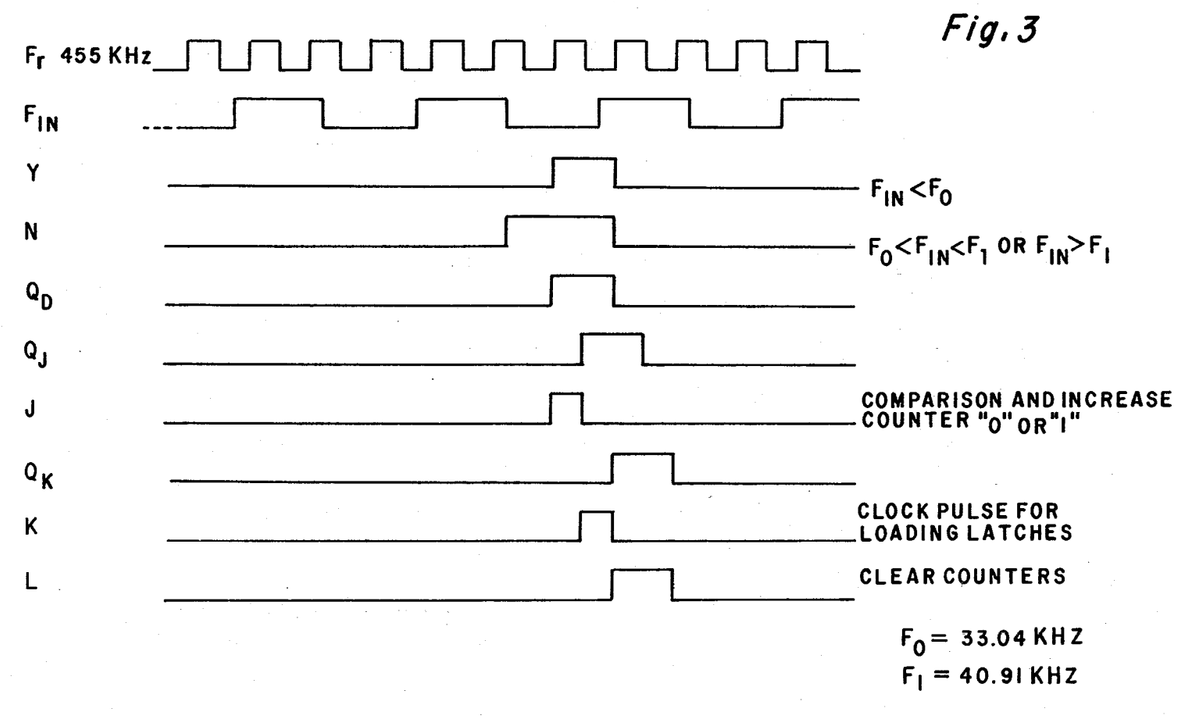
FIG. 3 shows a timing diagram related to the operation of the frequency discriminator of FIG. 2.

The overflow from divider 52 and the overflow from counter 56 are applied as respective inputs N and Y to an OR gate 58, the output of which is fed to a sequence generator 60 for generating outputs J, K, and L. When the input signal to divider 50 has a frequency less than that of the lowest command signal Fin, the counter 56 produces an overflow output Y prior to an overflow from divider 52. However, when the signal frequency received by divider 50 is in the valid command signal range, shown in TABLE B, or a higher frequency, the overflow N from divider 52 precedes that from counter 56. Timing relations between the J, K and L outputs from sequence generator 60 are shown in FIG. 3.

Assume that the dividers 50, 52, 54 and counter 56 have been cleared and a valid command signal is received at the input of divider 50. The divider 52 will produce an overflow N prior to an overflow Y from counter 56. The sequence generator 60 then at the leading edge of the next Fr pulse generates a J output pulse having a duration equal to a Fr pulse, which is applied as an enabling input to each of AND gates 62 and 64. Next, at the trailing edge of the J pulse, the sequence generator 60 generates a K pulse also having a duration equal to a Fr pulse which loads a 3-bit latch 66 with a digital word corresponding to the contents of the first three bits of counter 56. As shown by TABLE C, the first three bits uniquely identify the contents of the counter 32 for each of the counts 25 to 30 corresponding to valid command signal inputs Fin. As subsequently will be explained, following verification of the validity of the incoming command signal, the digital word stored by the latch 66 is decoded by a decoder 68 which produces an output on one of the channel outputs R1-R6 corresponding with the validated command signal.

TABLE C

| Count | Counter 56 | | | | |
| --- | --- | --- | --- | --- | --- |
| | A | B | C | D | E |
| 24 | 0 | 0 | 0 | 1 | 1 |
| 25 | 1 | 0 | 0 | 1 | 1 |
| 26 | 0 | 1 | 0 | 1 | 1 |
| 27 | 1 | 1 | 0 | 1 | 1 |
| 28 | 0 | 0 | 1 | 1 | 1 |
| 29 | 1 | 0 | 1 | 1 | 1 |
| 30 | 0 | 1 | 1 | 1 | 1 |
| 31 | 1 | 1 | 1 | 1 | 1 |

When the incoming command signal Fin is a valid command signal, the existence of a count between 24 and 31 in the counter 56 can be identified by the fact that the D and E stages of the counter each is in a logical 1 condition. In these circumstances, an AND gate 70 is enabled which in turn enables a comparison and logic circuit 72, which thereby is responsive only to conditions of the A, B and C stages of the counter 56 corresponding to counts of 25 to 30 inclusive, and compares the digital word defined by the states of bits A, B and C with the corresponding digital word of the next preceding detection cycle. When the digital words correspond, the comparison and logic circuit 72 enables and AND gate 64 with a V pulse to provide a single input signal to a ONE counter 74. When the digital word defined by stages A, B and C of counter 56 do not correspond with that of the preceding comparison cycle, the circuit 72 enables the AND gate 62 with a U pulse to provide a single input signal to a ZERO counter 76.

Any clock input signal U (Z) to the ONE (ZERO) counter also resets the ZERO (ONE) counter to zero, so that a string of X subsequent and uninterrupted ONE (ZERO) pulses is required to result in a ONE (ZERO) counter count of X.

Next, at the trailing edge of the K pulse, the sequence generator 60 generates an L output pulse having a duration equal to the period of Fr which clears the dividers 50, 52, 54 and counter 56 and initiates a new count and comparison cycle which proceeds as described above.

As long as the same valid command signal Fin is received corresponding to a particular channel, the comparison and logic circuit 72 produces a sequence of enabling pulses to AND gate 64 and increments the count of the ONE counter 74 (each increment also clearing the ZERO counter 76). When the incoming command signal has been validated by a predetermined number of successive inputs to the ONE counter 74, in the example being described 56 successive inputs, by detecting the decoded value of that predetermined count, that decoded output enables a latch 78 which enables AND gate 139. The AND gate 139 also receives a K pulse input and an input from the circuit 72 indicating a command signal in the valid range and applies an actuating input to the decoder 68 and disables the clock input of the latch 66, whereupon an output appears on the decoder channel output corresponding to the particular input command signal frequency.

If, during the reception of a particular valid command signal input Fin, a spurious noise signal outside the command signal frequency range is received, the AND gate 70 will not be enabled, so that the comparison and logic circuit 72 will then cease to apply an input to gate 139, will enable the AND gate 62 and increment the ZERO counter 76. If the counter 76 is incremented during 16 successive comparison cycles, (corresponding to an identical noise signal existing over that time period) the ZERO counter output is decoded and resets the R-S flip-flop 78 so that a validating input is not applied to the decoder 68. The latch 66 is enabled and thus can again be loaded from the counter 56. In the event, which is more usual, that any spurious noise inputs increment the ZERO counter during less than 16 successive comparison cycles, the ONE counter 74 is cleared until resumption of the particular valid command signal when the ZERO counter is again cleared, in the meantime, the set condition of the flip-flop 78 remaining unchanged.

It will be appreciated, therefore, that spurious short-term noise inputs to the receiver are not permitted to interfere with the valitading process of a valid incoming command frequency but that longer-term identical noise inputs terminate an existing validation sequence of an incoming command signal and automatically restart the validation cycle. In this manner a high degree of reliability is built into the receiver for discriminating against spurious noise signals in the command signal range with the result that activation of the receiver other than by a valid command signal is minimized.

Figure 5:
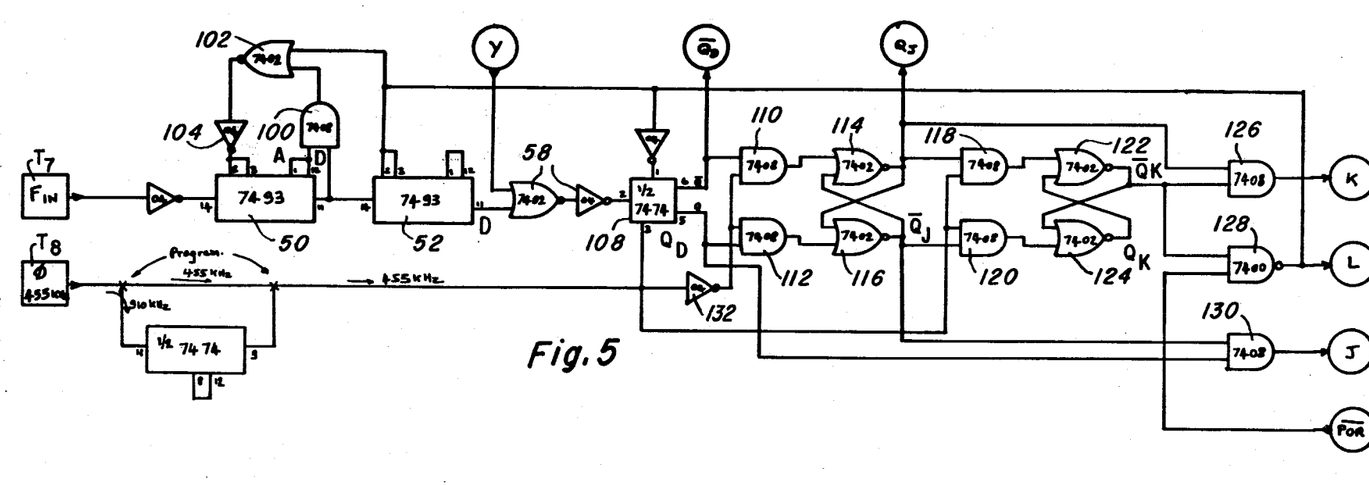
FIG. 5 is a logic diagram of the sequence generator shown in FIG. 2.

Implementation of the frequency discriminator logic of the remote control receiver so far described is shown in further detail in the logic diagrams of FIGS. 5-8. FIG. 5 shows the sequence generator 60 (FIG. 2). After filtering and amplification, incoming ultrasonic command signal pulses Fin are divided by the dividers 50 and 52 which divide by factors of 9 and 8 respectively. For example, the dividers may comprise 4-bit ripple through counters such as Type No. SN 7493 manufactured and sold by Texas Instruments Incorporated, Dallas, Texas. The divider 50 has its A and D outputs applied as inputs to an AND gate 100, the output of which is connected by NOR gate 102 and inverter 104 to the reset input of the divider, thereby providing the 9 divisor function. The D output of divider 50 is connected as the input to the divider 52, the D output of which corresponds to the N output of divider 52 shown in FIG. 2, so that the divider 52 effects a divide by 8 function. When the divider 50, 52 overflows, the N output provides a high input to the OR gate 58 (defined by a NOR gate and an inverter) so that the overflow N is present at the input of a positive edge triggering D-flip-flop 108. The flip-flop 108 synchronizes the positive edges of overflow pulses N with the 455kHz reference frequency Fr (see FIG. 3) which clocks the flip-flop 108. The sequence generator function is performed by a single master-slave shift register bit comprising gates 110-124 and three decoding gates 126, 128 and 130.

The master half of the shift register bit comprises AND gates 110 and 112 the outputs of which are connected as inputs to cross-coupled NOR gates 114 and 116. The slave half bit comprises AND gates 118, 120 and cross-coupled NOR gates 122 and 124, likewise connected. The reference frequency Fr is applied by inverter 132 as an input to each of AND gates 110 and 112, the other inputs of which are, respectively, the $Q_D$ and $\overline{Q}_D$ outputs from the flip-flop 108. The output $Q_J$ of the NOR gate 114 is applied as an input to each of the AND gates 118 and 126 while the $\overline{Q}_J$ output of the NOR gate 116 is applied as an input to each of the AND gates 120 and 130, the latter gate also receiving as an input the $Q_D$ output of the flip-flop 108. The $\overline{Q}_K$ output of the NOR gate 122 is applied as an output to each of AND gate 126 and NAND gate 128. The gates 126, 128 and 130 provide the K, L and J outputs of the sequence generator 60, described with reference to FIG. 2, in the following manner.

When an overflow signal N appears from counter 52 (see FIG. 3) it will be synchronized by the D flip-flop 108 and the $Q_D$ output will go high on the first positive edge of Fr. The master output $Q_J$ from gate 114 of the shift register bit will follow $Q_D$ on the first negative edge of Fr because AND gates 110 and 112 are clocked by $\overline{Fr}$. The decode of $Q_D \cdot \overline{Q}_J$ by AND gate 130 gives the first pulse J. Then the slave output $Q_K$ from gate 124 will follow this signal with the next positive edge of Fr. The decode of $Q_J \cdot \overline{Q}_K$ by AND gate 126 gives the pulse K. The pulse L from decode gate 128, resulting from $\overline{Q}_K + \overline{POR}$ will clear the dividers 50 and 52 initially when the power-ON reset signal POR is generated in response to connection of an external power supply to the TV receiver, and at the end of each comparison cycle with the signal $\overline{Q}_K$. At that time, the D flip-flop 108 is also cleared and after a new period of Fr, $Q_K$ and L go low and a new comparison cycle commecses.

Figure 6A:
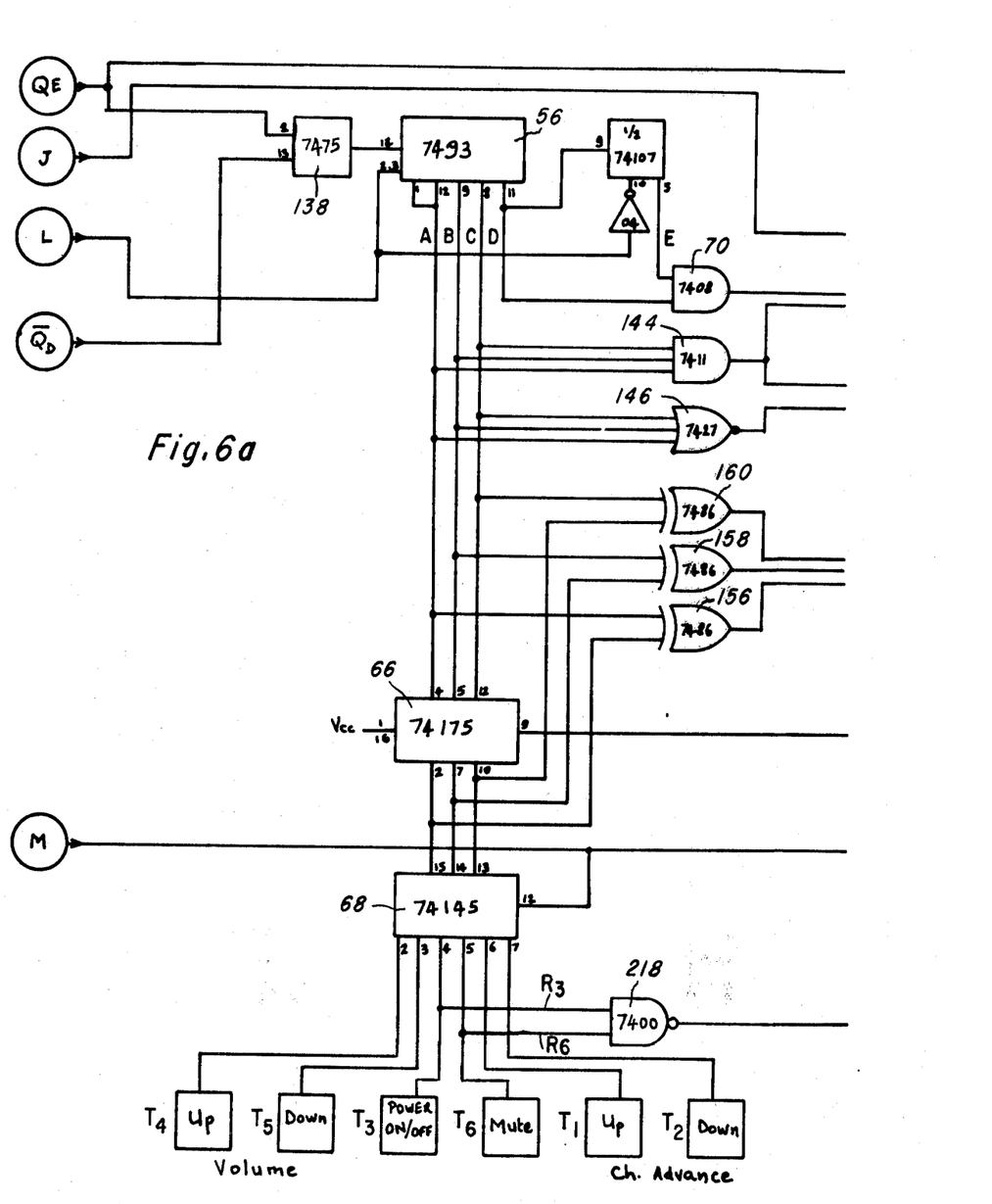
FIGS. 6a and 6b show a more detailed logic diagram of the frequency discriminator shown in FIG. 2.
Figure 6B:
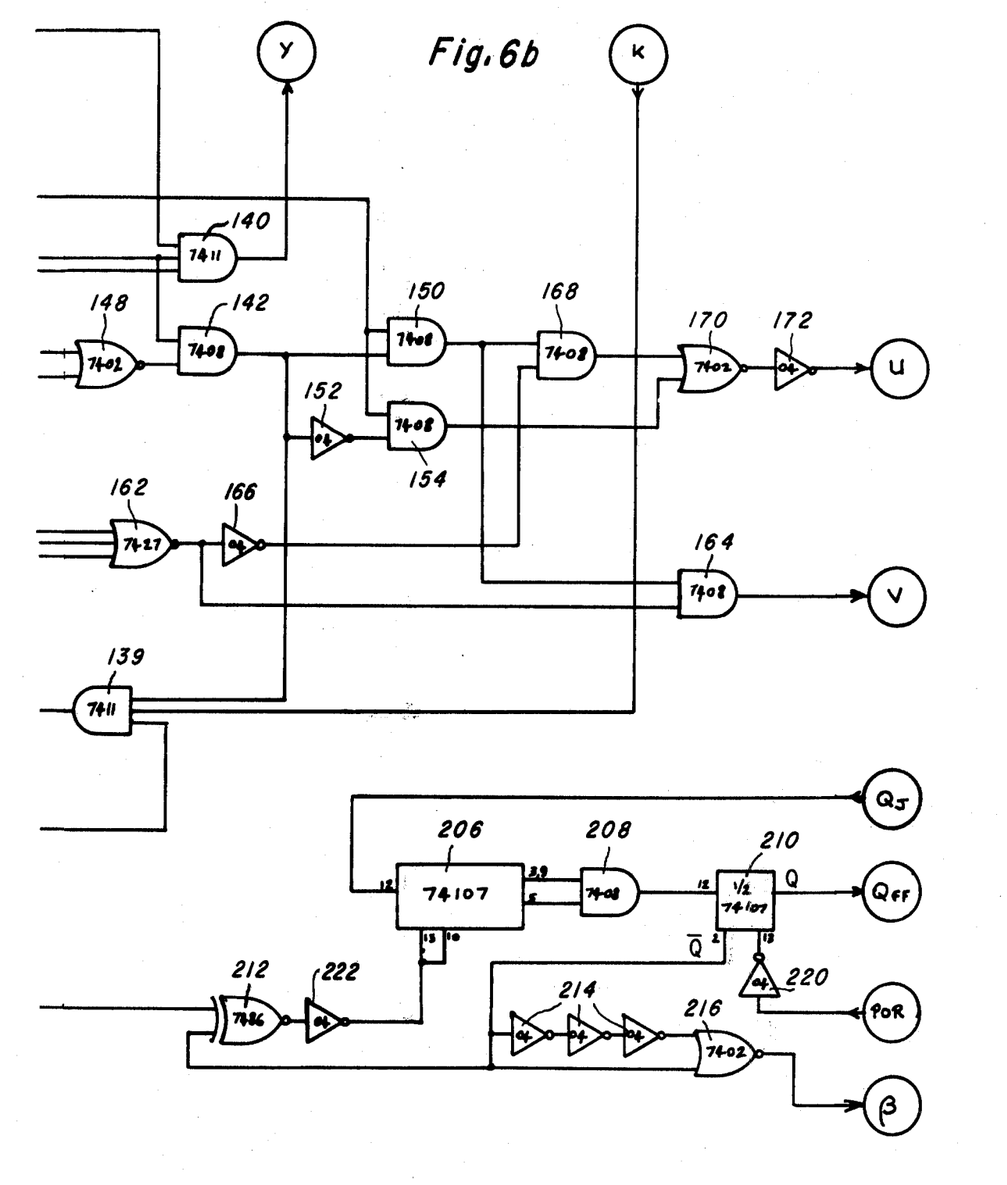

The divider 54 is implemented by a 4-bit ripple-through counter 134 (FIG. 7) and the first bit of a 4-bit ripple-through counter 136, the output from which is identified by $Q_E$ and applied via a latch 138 to the input of the counter 56 (FIG. 6). The latch 138 also receives an input $\overline{Q}_D$ (FIG. 5) and prevents the counter 56 from having transitions during the J and K pulses. Each comparison cycle of incoming command signal pulses is initiated by an overflow pulse N from the counter 52 (FIG. 5) and during a variable length comparison period, terminated by an overflow pulse N, the counters 134, 136 (FIG. 7) and 56 (FIG. 6) count a variable number of Fr pulses, the number counted depending on the frequency of an incoming command signal Fin. The number of Fr pulses so counted is analyzed and decoded. The pulse J from the sequence generator (FIG. 5) analyzes the comparison of the existing count of the counter 56 with the count during the preceding comparison cycle by controlling application of an input to the ONE counter 74 or to the ZERO counter 76 (FIG. 2) as will presently be explained. The K pulse is applied as an input to AND gate 139, to clock the 3-bit latch 66. The pulse L clears the counters 134, 136 (FIG. 7) and 56 (FIG. 6).

Figure 7A:
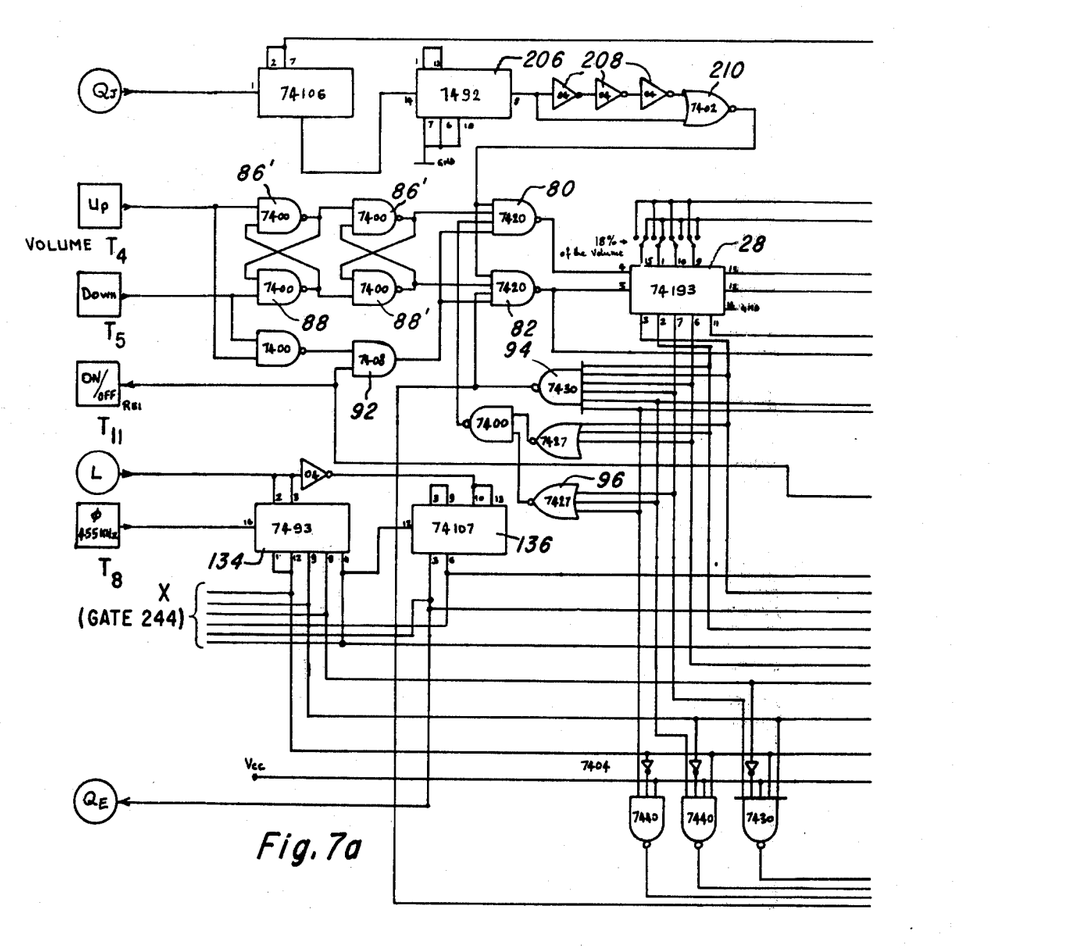
FIGS. 7a and 7b show a logic diagram of the volume control, power on/off and mute functions shown in FIG. 1.
Figure 7B:
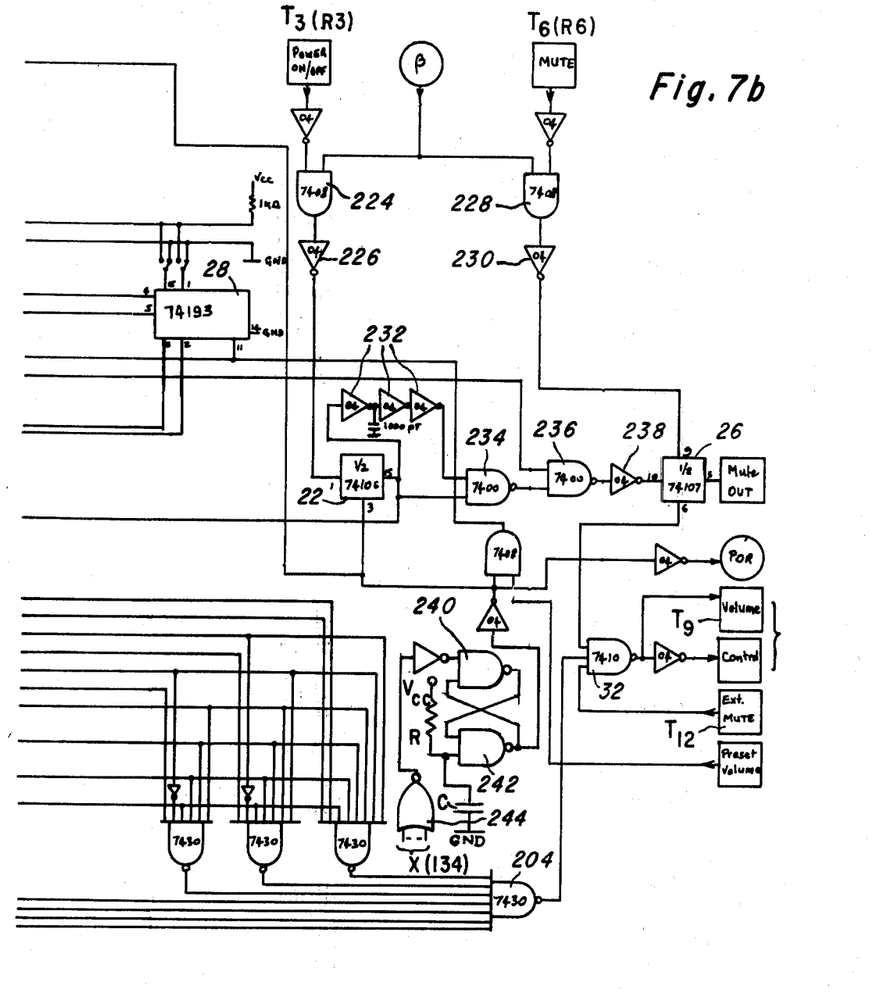

The D and E bits of the counter 56 are connected as inputs to the AND gate 70, so that when the D and E bits are high (logic one state), the AND gate 70 output is high, indicating that the count of the counter 56 is between 24 and 31. The output of gate 70 is connected as an input to each of AND gates 140 and 142, the former gate also connected to receive $Q_E$ (from counter 134, 136, FIG. 7) as an input. The A, B and C bits of counter 56 are connected as inputs to an AND gate 144 and to a NOR gate 146. The output of AND gate 144 is connected as an input to each of AND gate 140 and of a NOR gate 148, the output of the latter gate being connected as an input to the AND gate 142.

If the count of counter 56 is 31, the output of AND gate 144 will be high (since the A, B and C bits of counter 56 will each be in a logic one state). If the count of counter 56 is 24, the output of NOR gate 146 will be high (since the A, B and C bits of the counter each will be in a logic zero state). If the count of the counter 56 is between 25 and 30, the outputs of gates 144 and 146 each will be low and the output of gate 148 will be high, in turn causing the output of gate 142 to go high and apply inputs to the AND gate 139, to an AND gate 150 and via an inverter 152 to an AND gate 154.

The contents of the A, B and C bits of the counter 56 during a preceding detection cycle are stored in the 3-bit latch 66 the outputs of which are applied as inputs to EXCLUSIVE OR gates 156, 158 and 160, the current contents of the A, B and C bits of the counter 56 also correspondingly being applied as inputs to the gates 156, 158 and 160. The outputs of gates 156, 158 and 160 are applied as inputs to a NOR gate 162 whose output is applied directly to an AND gate 164 and via an inverter 166 to AND gate 168. The output of gate 150 applies inputs to gates 164 and 168, the latter gate and gate 154 applying inputs to a NOR gate 170 the output of which is inverted by an inverter 172.

When the count of the counter 56 is between 25 and 30 inclusive, the AND gate 142 receives a high input from gate 70 and from gate 148 (gates 144 and 146 being low), and enables the AND gate 150 so that the J pulse is transmitted by gate 150 to AND gates 164 and 168. If the existing count of counter 56 is the same as in the preceding comparison cycle, the outputs of each of the gates 156, 158 and 160 will be low and the resulting high output of gate 162 will enable gate 164 (and disable gate 168) so that the J pulse transmitted by gate 150 will appear at the output of gate 164 where it is identified as pulse V.

If the content of the A, B and C bits of the counter 56 are not the same as during the preceding comparison cycle, the gate 31 output will be low (at least one output from gates 156, 158 and 160 being high) disabling gate 164 and, via the inverter 166, enabling the gate 168 so that the J pulse is transmitted through gates 150, 168 and 170, and after inversion by the inverter 172 is identified as pulse U.

Figure 8:
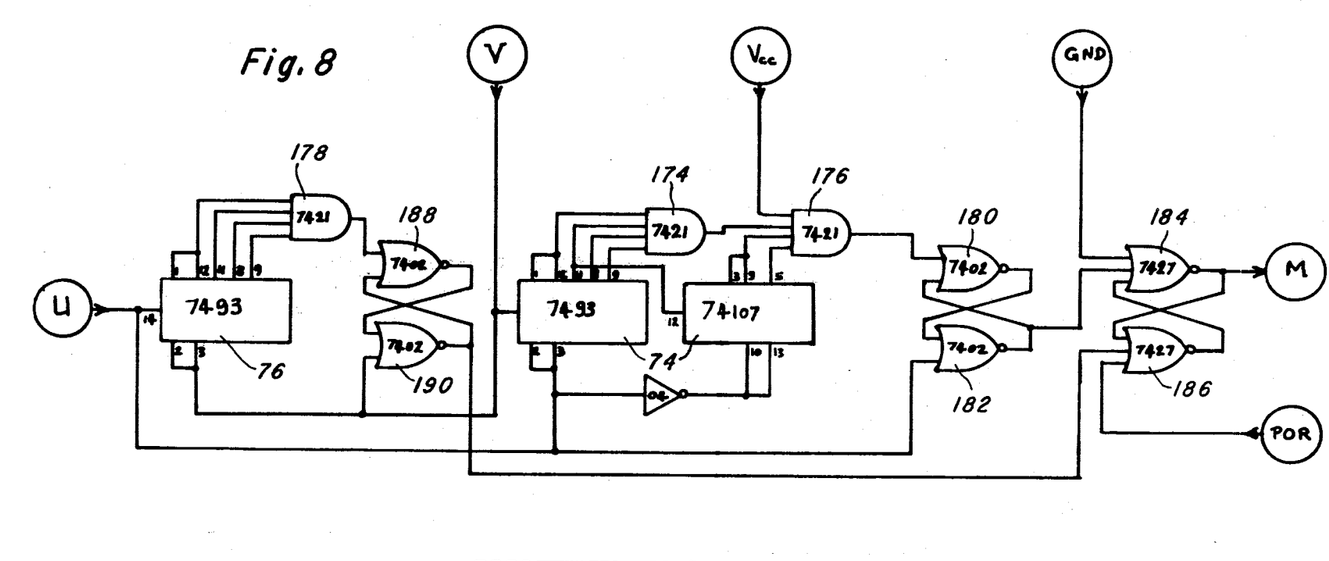
FIG. 8 is a logic diagram of the 1-counter and zero-counter shown in FIG. 1.

FIG. 8 shows implementation of the ONE counter 74, the ZERO counter 76, their associated decoders and the flip-flop 78, previously described with reference to FIG. 2.

The ONE counter 72 comprises a 6-bit J-K flip-flop ripple-through counter connected as shown to decode AND gates 174 and 176 so that gate 176 goes high with the count reaches 56. The ZERO counter 76 comprises a 4-bit J-K flip-flop ripple-through counter connected to a decode AND gate 178 which goes high when the count reaches 16. The counter 74 is loaded, and the counter 76 cleared, by V pulses. The counter 76 is loaded and the counter 74 is cleared by U pulses. The decode gate 176 is connected to apply a set input to an R-S flip-flop comprising NOR gates 180, 182, which in turn is connected to apply a set input to another R-S flip-flop comprising NOR gates 184, 186 and producing an output M. The decode gate 178 applies a set input to an R-S flip-flop comprising NOR gates 188 and 190 which receives a reset input from the V pulse line and applies a reset input to NOR gate 186 of the R-S flip-flop 184, 186. The flip-flop 180, 182 is reset by a U-pulse applied to the NOR gate 182.

Each time an incoming command signal Fin in the ultrasonic frequency range 33 to 41kHz is detected and validated during a comparison cycle as being identical to the received signal during the preceding comparison cycle, as described above with reference to FIG. 6, the resultant V pulse increases the count of the ONE counter 74, clears ZERO counter 76 and resets the flip-flop 188, 190. When 56 identical comparison cycles have been completed, the decode gate 176 goes high and sets the R-S flip-flop 180, 182 which in turn sets the flip-flop 184, 186 causing the output signal line M to go low. The low state of signal line M disables AND gate 139 (FIG. 6) and prevents loading of the 3-bit latch 66. In addition, the low condition of the output line M is applied to the decode circuit 68 (FIG. 6) causing an output line of that decoder, corresponding to the validated incoming command signal, to go low. If during the transmission of an ultrasonic command signal, the remote control receiver responds to a noise signal the J pulse will be transmitted by gates 150, 168, 170 and inverter 172 to provide a U pulse which clears the ONE counter 74 and resets the R-S flip-flop 180, 182 and increments the count of the ZERO counter 76. If the duration of this noise signal is less than 15 comparison cycles, the flip-flop 184, 186 remains in a set condition and the decoder 68 remains validated so that the previously validated command signal still appears at the corresponding decoder output. As soon as reception of the same command signal is re-established, the J pulses are gated by gates 150 and 164 to provide V pulses again so that no interruption in the decoded output signal from the decoder 68 results.

However, if the duration of the particular noise signal is longer than 15 comparison cycles, the decode gate 178 will go high and set the flip-flop 188, 190 which resets the flip-flop 184, 186, causing the output line M to go high so that a K pulse can be transmitted by AND gate 139 (FIG. 6) to permit loading of the 3-bit latch 66 from the counter 56. The decoder 68 is no longer validated and none of its outputs is in a low state.

Thus, in order to switch an output of the decoder 68 to a low state, a sequence of 56 identical comparison cycles must be completed in response to incoming command signals within the command frequency band so that a noise signal could result in switching of an output of the decoder 68 to a low state only if that noise signal is continuous without variation in its frequency for 16 comparison cycles which is a negligible possibility.

Furthermore, in order to switch an output of the decoder 68 from a low condition to a high condition during the transmission of a particular command signal frequency, an incoming noise signal frequency detected by the receiver must have an amplitude of the same order as the command frequency and be continuously present for 15 comparison cycles, which also is a negligible possibility.

Figure 4:
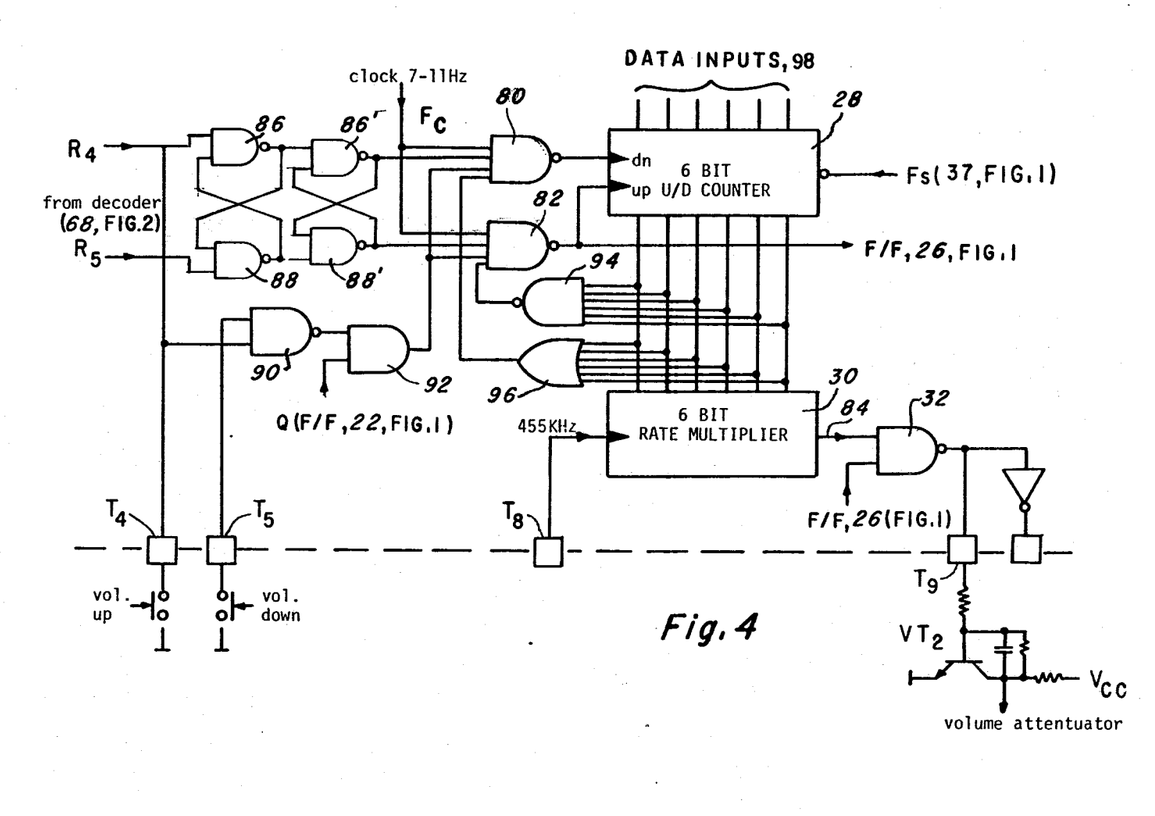
FIG. 4 is a functional logic diagram of the volume control circuit shown in FIG. 1.

The up/down volume control logic is further illustrated by FIG. 4. The 6-bit up/down counter 28 has its broadside outputs connected to the rate inputs of the 6-bit rate multiplier 30. One example of a suitable rate multiplier circuit is that used in the integrated circuit type number SN 7497 manufactured and sold by Texas Instruments Incorporated, Dallas, Tex., and described in Texas Instruments Application Report, Bulletin CA-160, modified by disconnection of the clock inputs from the AND gates to which the rate inputs are applied. The counter 28 is clocked by a slow frequency Fc, suitably 7 to 11Hz, applied via one of two NAND gate 80 and 82 while the rate multiplier 30 is clocked by Fr (455kHz). The rate multiplier, during a period of 64 input pulses of Fr passes N input pulses to the output 84, where N is the binary number present at the rate inputs i.e. the broadside outputs of the counter 28. If the rate inputs are all logic ones, the output of the rate multiplier 30 is identical to the clock input Fr. If the clock Fr has a 50% duty cycle, the rate multiplier output also has a 50% duty cycle. If the rate inputs are all logic zeros, except the most significant bit, then only 50% of the clock pulses Fr are passed to the rate multiplier output 84 and the average duty cycle is 25%. If the rate inputs are all logic zeros, then no clock pulses Fr are passed to the output 84 and the output duty cycle therefore is zero. The rate multiplier output 84 is connected by NAND gate 32 to the base of the transistor VT2, as previously described with reference to FIG. 1, for integration of the rate multiplier output pulses to provide a d.c. volume control voltage which ranges from zero volts to Vcc/2 according the state of the broadside outputs of the up/down counter 28. Thus, as the count of the counter 28 is incremented or decremented, the d.c. collector voltage of transistor VT2 will respectively increase or decrease accordingly. By increasing the input duty cycle of the rate multiplier clock frequency Fr, a corresponding linear increase is obtained in the output duty cycle of the rate multiplier e.g. a 90% clock input duty cycle will result in a d.c. level range after integration, at the collector of transistor VT2, between 90% Vcc and zero volts. By selecting the integration time constant associated with transistor VT2 to be significantly longer than the period of Fr divided by 64, the collector d.c. voltage of transistor VT2 can be made independent of the clock frequency Fr.

The frequency discriminator logic output R4 and the manual volume up switch SW2 (see FIG. 1) are connected to one input of a NAND gate 86, which is cross coupled with NAND gate 88 to provide a latch which is cascaded with a further NAND gate latch 86′, 88′ and to an input of a NAND gate 90. The cascaded latches protect against simultaneous closing of the volume switches SW4 and SW5. The discriminator logic output R5 and the manual volume down control switch SW3 (see FIG. 1) are connected to an input of the NAND gate 88 and also to an input of the NAND gate 90, the output of which together with the Q output from the flip-flop 22 (FIG. 1) are applied as inputs to an AND gate 92, the output of which is connected as an input to each of the NAND gates 80 and 82. The outputs of the latch NAND gates 86′ and 88′ are connected as inputs to NAND gates 80 and 82 respectively, each of which also receives the low frequency clock Fc as an input. The broadside outputs of the counter 28 are connected as inputs to the NAND gate 94 and an OR gate 96. The outputs of gates 94 and 96 are connected as inputs to NAND gates 82 and 80 respectively.

If one of the manual volume control switches SW1 or SW2 is closed or one of the outputs R4 or R5 goes low, the corresponding latch output from gate 86′ or gate 88′ goes high and remains high until the other count direction is selected. The output of NAND gate 90 is high only as long as one of its inputs is low, and in turn the output of AND gate 92 is high but only if the flip-flop 22 is on i.e. only when the d.c. power supply (V+) to the television receiver has been switched on. If the flip-flop 22 output is off, the output of AND gate 92 remains low, thus disabling both of the up/down counter clock gates 80 and 82. The slow clock pulse Fc for the up/down counter 28 can pass through only one of the gates 80 and 82 because of the inverted latch outputs from gates 86 and 88 and only if all other inputs of the gates 80 and 82 are high. Thus, the counter 28 can be incremented by the clock input Fc only if the switch SW2 is closed or the frequency detector logic output R4 is low and the output of flip-flop 22 is high and the bits of the up/down counter 28 are not all in a logic one condition which would cause gate 94 to inhibit the up gate 82. The count of the counter 28 can be decremented only if the volume down switch SW3 is depressed or the frequency discriminator logic output R5 is low *and* the output of the flip-flop 22 is high *and* the bits of the up/down counter 28 are not all in the logic zero state which would cause gate 96 to inhibit the down counter gate 80.

By provision of the gates 94 and 96 which respectively detect the all one and all zero state of the counter 28, and then inhibit the associated gate 80 or 82, the counter 28 is provided with two end stops thereby preventing the counter from overflowing or underflowing.

The counter 28 can be loaded with a predetermined binary number at the data inputs 98 by application of a load signal Fs by AND gate 82 which occurs when either a manual volume preset switch SW7 is closed or the power supply to the remote control receiver is initially established. When the television receiver is plugged into an external power supply, standby d.c. power (Vcc) is supplied to the remote control receiver, even when the d.c. supply (V+) for the television receiver itself is switched off. The power-on reset circuit 31 (FIG. 1) included in the remote control receiver utilizes an R-S flip-flop comprising cross coupled NAND gates 240, 242, (FIG. 7) a power-on reset output (POR) being obtained from the gate 242. At the time the television receiver is initially connected to the external supply (or following power resumption after a blackout), the capacitor C is in a discharged state, the resistor R (functioning as a current source) connected to the Vcc supply of the remote control receiver having a large value, e.g. 5M ohms. Thus, the POR line goes to a logic 1 level. At this time, also the stages of the counters 134, 136 are in a random state and the output of the decode gate 244 will be a logic 1 and the POR line will remain at a logic 1 level. During this time the counters 134, 136 are cleared, the decode gate 244 detects the all zero states of the counter stages and its output is at the logic zero level, toggling the flip-flop 240, 242 so that the POR line goes to a logic zero level. Capacitor C becomes charged through the resistor R to a logic one level.

When the POR line is switched to the logic one level, it clears the flip-flop 22, ensuring that the power transistor VT1 is switched off, and applies an $F_S$ input to the up/down counter 28 over gate 36 to set that counter to a predetermined count as previously described. By this means it can be ensured that the television receiver sound output is at an acceptable level when the receiver is initially switched on.

The anti-bouncing devices 20 and 34 shown in FIG. 1 are implemented (FIG. 6) by a counter 206 and a decoding AND gate 208 which decodes an 11 count of the counter 206, a flip-flop 210 and a comparator comprising an EXCLUSIVE NOR gate 212. The $\bar{Q}$ output of the flip-flop 210 is differentiated by the inverters 214 and NOR gate 216. A NAND gate 218 is connected to supply an input to the comparator 212 and receives inputs from the POWER ON/OFF and MUTE outputs R3 and R6 of the decoder 68.

Figure 9:
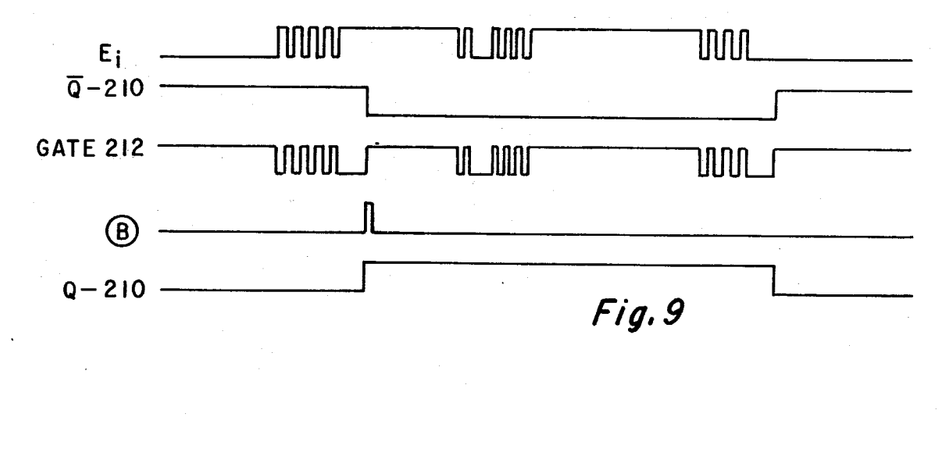
FIG. 9 is a timing diagram illustrative of the operation of the anti-bouncing circuit shown in FIG. 6.

When the television receiver power is switched on initially, the power on reset pulse POR is supplied via an inverter 220 as a clear pulse to the flip-flop 210 the $\bar{Q}$ output of which goes high. If the remote control receiver POWER ON/OFF or MUTE functions are not actuated, the gate 218 will not receive a low input and the comparator 212 output will be high so that the counter 206 will continuously be cleared via inverter 222. When either the POWER ON/OFF or MUTE manual switch is actuated, giving rise to signal bounce on the R3 or R6 output line of decoder 68, as illustrated by the pulse train $E_i$ in FIG. 9, the output of comparator 212 will be the inverse of $E_i$ (see FIG. 9) and at each bounce, the counter 206 will be cleared via the inverter 222. When the bounce condition terminates, the output of comparator 212 remains low and the counter 206 commences to count $Q_J$ pulses. When the count reaches 11 the output of decoder gate 208 goes high and toggles the flip-flop 210 and the counter is again cleared via the comparator 212 and inverter 222. The output $Q_{FF}$ of flip-flop 210 is applied as a clock input to the counter 206. The negative going edge of the $\overline{Q}$ output of the flip-flop 210 is differentiated by the inverter chain 214 producing a pulse $\beta$ at the output of the NOR gate 26. The $\beta$ pulses are used to sample the POWER ON/OFF command output (R3) through an AND gate 224 (FIG. 7) and an inverter 226, or a MUTE command output (R6) through an AND gate 228 and inverter 230.

When a POWER ON/OFF command is gated by a $\beta$ pulse from NOR gate 216, it triggers the flip-flop 22, the Q output of which applies an input to the AND gate 92 and via terminal T11 switches the transistor VT1 to a conductive state. The Q output of the flip-flop 22 is differentiated by delaying inverters 232 (24 FIG. 1) and NAND gate 234 to produce a positive spike which is applied together with the output of gate 82 as inputs to an OR gate comprising NAND gate 236 and inverter 238 for clearing the MUTE flip-flop 26. Any time the flip-flop 22 is toggled or the volume adjusted upward, the MUTE flip-flop 26 is cleared so that the gate 32 is inhibited and the collector of transistor VT2 (FIG. 1) goes to ground. By this means, the sound output from the TV receiver can be cut off temporarily, and later turned on at its previous level. The gate 32 receives inputs from the output gate 204 of the bit rate multiplier, the $\overline{Q}$ output of the flip-flop 26 and, over terminal T12, an external electronic mute control signal from the TV receiver. The flip-flop 26 receives a toggle input from the inverter 230 so that a command signal on the decoder MUTE output R6 sampled by the data pulses is transmitted by AND gate 228.

The foregoing described embodiment of the invention is thus seen to be particularly suited for providing a remote control receiver particularly suited for use in TV broadcast receivers. The receiver described enjoys the advantages of providing efficient and reliable operation while being relatively economical to manufacture, it being appreciated that the receiver 10 identified in broken-line outline in FIG. 1 is readily amenable to fabrication as a single chip integrated circuit. The receiver design is not restricted to the six function configuration described above and by straight-forward modification a fewer or larger number of functions can be provided using the principles described.

What is claimed is:

1. Remote control receiver for receiving continuous wave command signal pulses of different operating frequencies in individual signal channels within a selected frequency range; said receiver having an individual output for each signal channel; means for dividing the frequency of received command signal pulses by a predetermined factor to produce sequence control pulses; sequence generator means responsive to each sequence control pulse resulting from reception of a command signal within the selected frequency range to initiate a new counting cycle; reference frequency counter means for counting in each of said counting cycles reference frequency pulses having a frequency significantly higher than command signals in said selected frequency range; said command signal pulses in each channel giving rise to a different predetermined count of said reference frequency counter means during a counting cycle; storage means for storing the count of the reference frequency counter reached during a counting cycle; comparator circuit means for comparing at the end of each said counting cycle the count of said reference frequency counter means with the existing count stored by said storage means and for producing a first signal indicating identity between such counts and a second signal indicating non-identity between said counts; second and third counter means; means for applying said first signals as count inputs to said second counter means and as clear inputs to said third counter means; means for applying said second signals as count inputs to said third counter means and as clear inputs to said second counter means; decoder circuit means connected for receiving the count stored by said storage means to generage an output signal at an output of said receiver determined by said count; validation means selectively actuable to transfer the count of said storage means to said decoder circuit means; means responsive to a predetermined count of said second counter means to activate said validation means and means responsive only to a different predetermined count of said third counter means to inactivate said validation means.

2. A remote control receiver according to claim 1, wherein said means for activating and inactivating said validation means, following response to said predetermined count of said second counter means, is adapted to continue to activate said validation means during sequences of said second signals less than said different predetermined count.

3. A remote control receiver according to claim 2, wherein said means for activating and inactivating said validation means includes a first flip-flop having an output connected to said validating means, a second flip-flop connected to apply a set input to said first flip-flop and to receive a set input from second counter means when said predetermined count thereof is reached, and a third flip-flop connected to apply a reset input to said first flip-flop and to receive a set input from said third counter means when said predetermined count thereof is reached.

4. A remote control receiver according to claim 1, further including up/down counter means having n stages, where n is an integer, means connecting first and second outputs of said decoder circuit means to respective input gating means for controlling application of clock pulses to up and down inputs of said up/down counter; digital word to duty cycle converter means for receiving input pulses at a selected frequency, said converter means having n rate inputs, means connecting said n stages of said up/down counter means to respective ones of said n rate inputs to apply a digit word thereto to control the output duty cycle of said converter means as a function of the count of said up/down counter means.

5. A remote control receiver as set forth in claim 4, wherein said converter means includes an n-bit counter and a sequence of n multi-input gating means each connected to receive a number of inputs from the bits of said n-bit counter means according to its rank in said sequence, and means connecting the bit output of said up/down counter means as respective inputs to said multi-input gating means having outputs connected as inputs to a single output gating means for producing an output signal in response to an output from any of said multi-input gating means.

6. A remote control receiver according to claim 5, wherein said n-bit counter additionally forms part of said reference frequency counter.

7. A remote control receiver according to claim 1, wherein said predetermined count of said second counter is approximately four times that of said third counter.

8. A remote control receiver according to claim 1, including first and second AND-gating means respectively connected to receive inputs from two of said receiver outputs and to apply inputs to respective first and second flip-flops, a further counter means connected to receive count inputs from said sequence generator outputs, gating means having inputs connected respectively to said two receiver outputs and an output connected to a clear input of said further counter means, said gating means responsive to transients at either one of said two receiver outputs to apply clear inputs to said counter such that said counter commences a count only on termination of said transients, and means responsive to a predetermined count of said counter to apply enabling inputs to said third and second AND-gating means and to apply a clear input to said further counter means.

9. In a television broadcast receiver, a remote control receiver for receiving continuous wave command signal pulses of different operating frequencies in individual signal channels within a selected frequency range; said receiver having an individual output for each signal channel; means for dividing the frequency of received command signal pulses by predetermined factor to produce sequence control pulses; sequence generator means responsive to each sequence control pulse resulting from reception of a command signal within the selected frequency range to initiate a new counting cycle; reference frequency counter means for counting in each of said counting cycles reference frequency pulses having a frequency significantly higher than command signals in said selected frequency range; said command signal pulses in each channel giving rise to a different predetermined count of said reference frequency counter means during a counting cycle; storage means for storing the count of the reference frequency counter reached during a counting cycle; comparator circuit means for comparing at the end of each said counting cycle the count of said reference frequency counter means with the existing count stored by said storage means and for producing a first signal indicating identity between such counts and a second indicating non-identity between such counts; second and third counter means; means for applying said first signals as count inputs to said second counter means and as clear inputs to said third counter means; means for applying said second signals as count inputs to said third counter means and as clear inputs to said second counter means; decoder circuit means connected for receiving the count stored by said storage means to generate an output signal at an output of said receiver determined by said count; validation means selectively actuable to transfer the count of said storage means to said decoder circuit means; means responsive to a predetermined count of said second counter means to activate said validation means and means responsive only to a different predetermined count of said third counter means to inactivate said validation means; said broadcast receiver further including manually operable switch means connected in parallel with individual ones of said remote control receiver outputs for operation to produce an output signal thereat.

10. The combination according to claim 9, wherein said remote control receiver includes anti-bounce circuit means connected to at least some of said remote control receiver outputs for response to transient conditions of said output signals to prevent propagation thereof while said transients are present.

11. The combination according to claim 10, wherein said anti-bounce circuit means includes first and second AND-gating means respectively connected to receive inputs from two of said remote control receiver outputs and to apply inputs to respective first and second flip-flops; a further counter means connected to receive count inputs from said requence generator outputs; gating means having inputs connected respectively to said two remote control receiver outputs and an output connected to a clear input of said further means; said gating means responsive to transients at either one of said two receiver outputs to apply clear inputs to said counter such that said counter commences a count only on termination of said transients; and means responsive to a predetermined count of said counter to apply enabling inputs to said third and second AND-gating means and to apply a clear input to said further counting means.

12. The combination according to claim 10, wherein said broadcast receiver further includes means for integrating the variable duty cycle output of said converter means to provide a variable d.c. voltage for controlling electronic sound attenuator means of said broadcast receiver.

13. The combination according to claim 12, wherein said remote control receiver includes gating means operable in response to an output signal from one of said remote control receiver outputs for preventing application to said variable duty cycle output from said converter means to said integrator means, to mute sound output from said television broadcast receiver.

14. The combination according to claim 9, wherein said broadcast receiver further includes semiconductor switching means for connecting and disconnecting a d.c. supply to said television receiver, and toggle means connecting one of said outputs of said remote control receiver to said semiconductor switching means for operation thereof.

15. The combination according to claim 14, wherein said remote control receiver includes power-on reset means responsive to initial connection, and connection after disconnection, of an a.c. power supply to said broadcast receiver to activate said toggle means to operate said semiconductor switching means to disconnect said d.c. supply to said broadcast receiver.

16. The combination according to claim 15, wherein said power-on reset means includes R-S flip-flop means formed as part of said remote-control receiver.

* * * * *